US008148055B2

(12) United States Patent
Oppermann et al.

(10) Patent No.: US 8,148,055 B2
(45) Date of Patent: Apr. 3, 2012

(54) METHOD FOR DEVELOPING A PHOTORESIST

(75) Inventors: Klaus-Guenter Oppermann, Holzkirchen (DE); Martin Franosch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 689 days.

(21) Appl. No.: 11/771,898

(22) Filed: Jun. 29, 2007

(65) Prior Publication Data

US 2008/0020330 A1   Jan. 24, 2008

Related U.S. Application Data

(60) Provisional application No. 60/818,241, filed on Jun. 30, 2006.

(51) Int. Cl.
*G03F 7/32* (2006.01)
*G03F 7/42* (2006.01)

(52) U.S. Cl. .......... 430/436; 430/329; 430/331

(58) Field of Classification Search .......... 430/322, 430/331, 311, 325, 329, 434, 435, 436
See application file for complete search history.

(56) References Cited

U.S. PATENT DOCUMENTS

| | | | |
|---|---|---|---|
| 3,930,857 A | 1/1976 | Bendz et al. | |
| 4,024,293 A | 5/1977 | Hatzakis | |
| 4,514,748 A * | 4/1985 | Bean et al. | 257/184 |
| 4,828,965 A * | 5/1989 | West et al. | 430/309 |
| 5,151,340 A * | 9/1992 | Tadros | 430/192 |
| 5,244,759 A * | 9/1993 | Pierrat | 430/5 |
| 5,300,404 A * | 4/1994 | Tani et al. | 430/326 |
| 5,547,789 A * | 8/1996 | Nakatani et al. | 430/5 |
| 5,650,261 A * | 7/1997 | Winkle | 430/270.1 |
| 5,897,982 A | 4/1999 | Shibata et al. | |
| 6,107,009 A * | 8/2000 | Tan | 430/331 |
| 6,132,941 A * | 10/2000 | Twist | 430/398 |
| 6,159,662 A * | 12/2000 | Chen et al. | 430/313 |
| 6,251,567 B1 * | 6/2001 | Reinecke et al. | 430/325 |
| 6,352,818 B1 * | 3/2002 | Hsieh | 430/322 |
| 2002/0126377 A1* | 9/2002 | Nakagawa et al. | 359/443 |
| 2006/0137711 A1* | 6/2006 | Liao | 134/1.2 |
| 2006/0183325 A1 | 8/2006 | Franosch et al. | |

FOREIGN PATENT DOCUMENTS

| | | |
|---|---|---|
| DE | 697 29 902 T2 | 7/2005 |
| DE | 10 2004 002 550 A1 | 8/2005 |
| DE | 10 2005 002 550 A1 | 7/2006 |
| JP | 2003-303752 * | 10/2003 |

OTHER PUBLICATIONS

Machine translation of JP 2003-303752 published on Oct. 24, 2003.*

* cited by examiner

*Primary Examiner* — Anca Eoff
(74) *Attorney, Agent, or Firm* — Slater & Matsil, L.L.P.

(57) ABSTRACT

A method for developing a photoresist includes applying a first developer to the photoresist to remove non-cross-linked areas of the photoresist, and applying a second developer to the photoresist to remove remaining non-cross-linked areas of the photoresist, wherein the first developer and the second developer differ in their compositions.

37 Claims, 2 Drawing Sheets

METHOD FOR DEVELOPING A PHOTORESIST

This application claims the benefit of U.S. Provisional Application No. 60/818,241, filed on Jun. 30, 2006, entitled "Verfahren zum entwickeln eines photolacks," which application is hereby incorporated herein by reference.

TECHNICAL FIELD

The present invention relates to a method for developing a photoresist.

BACKGROUND

For structuring hard-to-etch substances, such as gold, lift-off methods or methods for the structured application of a coating material on a material structure are employed in semiconductor technology, for example, when processing wafers. Here, photoresist, such as negative resist, is applied on a material structure, such as a multi-layer construction, a substrate, or a wafer, and then partially exposed. After exposing the photoresist, baking the material structure, on which the photoresist has been applied, may take place, in order to strengthen the cross-linkage of the negative resist. After baking, the negative resist is developed. Then, a coating material is applied on the material structure with the structured resist layer over the entire area, whereupon the negative resist is removed, and along with it the coating material layer applied thereon. In the areas in which the photoresist has not been removed, the material structure is not coated with the coating material. In the lift-off method, a positive resist may also be used. Here, the exposed areas are dissolved out or removed by the developer.

For developing the negative resist, an aqueous solution of TMAH or tetra methyl ammonium hydroxide material may be applied. This solution is highly alkaline, with the pH ranging from 13.5 to 14, so that corrosion may occur in the solution during the developing process when contacting metal on the material structure by the developer. This corrosion increasingly occurs when a stack of different metals is in direct contact with each other and at the same time has contact to the developer through the procedural sequence. One result of the corrosion is an attack on contact pads applied on the wafer, for example. As a result of the corrosion, these have diminished bondability and also often are not suited as under-bump metallization. The destruction of the contacts pads by the corrosion thus leads to reduced fabrication yield.

The corrosion of contact pads on the wafer is especially disadvantageous in the production of bulk acoustic wave filters or BAW filters, which are employed in mobile telephones. There, when measuring the frequency, which is still performed in industrial fabrication methods advantageously on wafer level, the stacks are contacted with a conducting measurement tip, in order to check the frequency response of the BAW filters, which often leads to the needle piercing metal layers in the contact pad and the metals in the contacting region blending with each other. The metals blended with each other form a plurality of corrosion elements, among which the less noble metal is dissolved during the ensuing development process, i.e., developing the negative resist.

Apart from aqueous developers, polar organic developers not having the above problem also exist. Independently of the developer used, it is desirable if a protruding edge develops at the periphery of the cross-linked part of the resist, because this provides for the tear-off edge in the coating material applied on the structured resist, and through which the solvent can dissolve the cross-linked part in the subsequent step, and hence lift off the coating material located thereon.

SUMMARY OF THE INVENTION

According to an embodiment of the invention, a method for developing a photoresist may comprise: applying a first developer to the photoresist to remove non-cross-linked areas of the photoresist, and applying a second developer to the photoresist to remove remaining non-cross-linked areas of the photoresist, wherein the first developer and the second developer differ in their compositions.

According to another embodiment of the invention, a lift-off method may comprise: providing a material structure, applying a photoresist onto a surface of the material structure, partially exposing the photoresist, developing the photoresist by means of applying a first developer to the photoresist, to remove non-cross-linked areas of the photoresist, and applying a second developer to the photoresist to remove remaining non-cross-linked areas of the photoresist. In this way, the photoresist is removed in a first area of the surface and the photoresist remains in a second area of the surface, wherein the first developer and the second developer differ in their compositions. The embodiment further comprises applying a coating material on the surface of the material structure and the developed photoresist and removing the developed photoresist, so that the coating material only remains in the first area.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
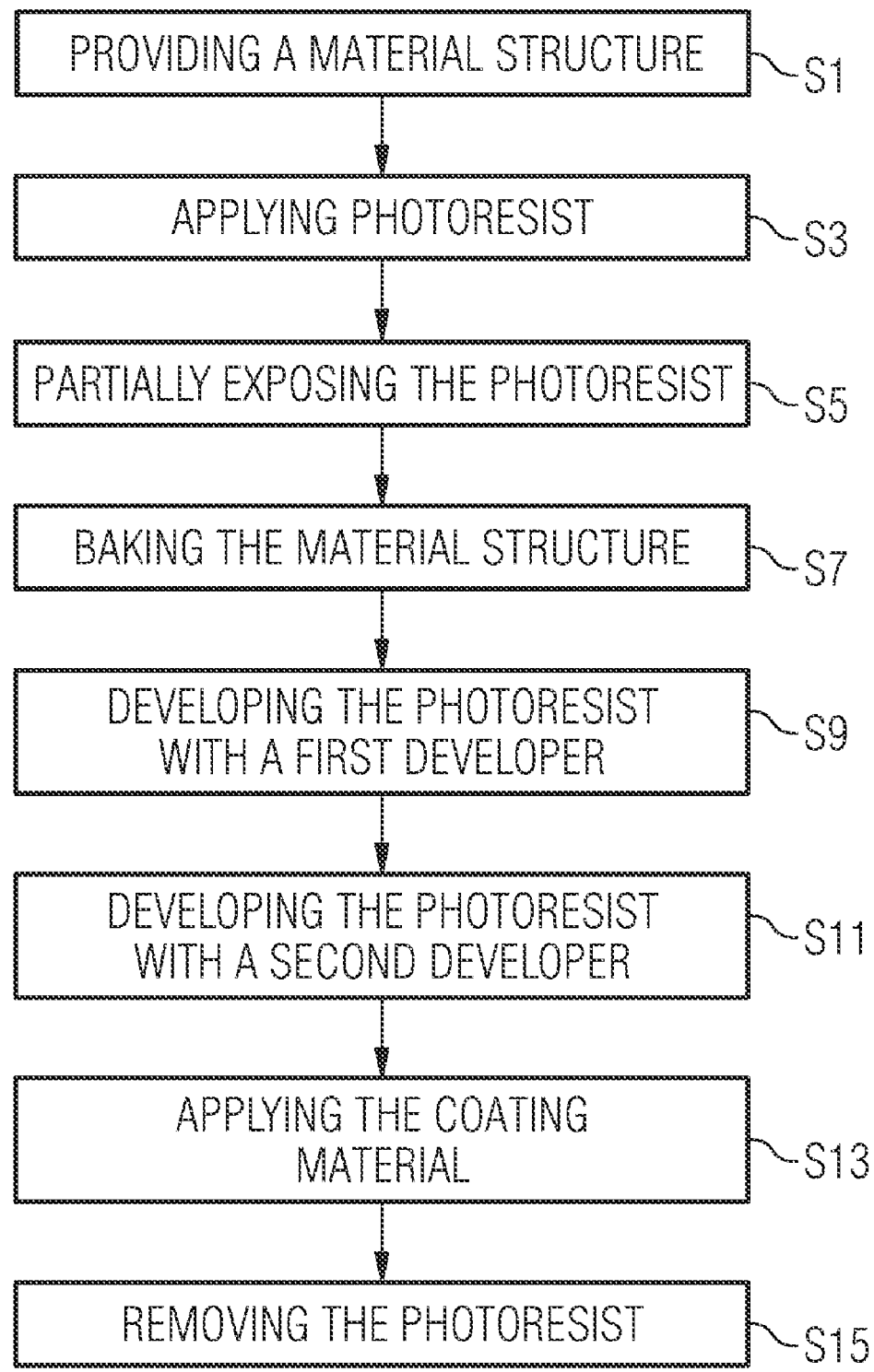
FIG. 1 shows a lift-off method according to an embodiment of the present invention.

FIG. 1 explains a course of a lift-off method according to an embodiment of the present invention. In a step S1, a material structure, such as a wafer with contact pads, is provided. In a following step S3, a negative resist is applied on a surface of the material structure. Then, in a step S5, the surface on which the negative resist is applied is partially exposed, so that the areas of the negative resist, which are supposed to remain on the surface in the ensuing developing of the photoresist, and on which the coating material applied on the material structure with the lift-off method is not to be present later, are irradiated with light.

Thereafter, in step S7, baking the material structure, on which the negative resist has been applied on a surface thereof, is performed. Here, the material structure is baked, for example, in an oven at a temperature of about 120° C. over a period of about 600 seconds. Baking the material structure leads to increased cross-linkage of the negative resist or to curing of the negative resist. The aim of baking is to increase the cross-linkage of the negative resist in the exposed area so that the negative resist is not dissolved out in ensuing developing.

Thereafter, in step S9, the negative resist is developed with a first developer, here e.g. a 2-propanol. The 2-propanol solvent now selectively dissolves the negative resist in the areas of the photoresist that have remained uncross-linked in the step S9, i.e., have not been exposed, while the exposed, and hence cross-linked, areas remain. The duration of developing the photoresist with the first developer is, e.g., about 30 seconds.

Thereafter, in step S11, the negative resist is developed with a further developer, here, e.g., a PGMEA, over a period of, e.g., about 20 seconds, wherein the further developer differs from that developer from the step S9. The PGMEA selectively dissolves the negative resist also in the areas of the photoresist that have not been exposed in step S5, while the exposed, and hence cross-linked, areas remain. The developer or second developer here develops the exposed part of the photoresist remaining after step S9. After developing with the sequence or series of the two solvents, namely the 2-propanol and the PGMEA, only the areas of the photoresist that have been exposed in the step S5 remain on the surface of the material structure.

It is advantageous in the temporally successive development with two developers or two solvents just described, exemplary the 2-propanol solvent and the PGMEA, that the layer of the photoresist thus structured or developed is characterized by improved undercuts of the resist flank, and the probability that resist films of the photoresist remain in the non-cross-linked areas that have not been exposed in the step S5 on the surface of the material structure is reduced. Altogether, this procedure thus allows for the efficient and/or less disturbance-prone execution of lift-off methods due to the improved tear-off edge properties, as still to be explained in detail in the following.

Then, in step S13, coating material, such as gold, titanium, or platinum is vapor-deposited on the surface of the material structure on which the negative resist has originally been applied. Thus, a layer of the coating material then covers the material structure at the locations at which the photoresist has been removed when developing S9, while at the same time the remaining photoresist areas are also coated by a coating material layer.

As previously mentioned, in the embodiment of the present invention, since the probability of an occurrence of resist films in the areas in which the photoresist actually should have been completely removed during developing S9, S11 is reduced, a probability of the occurrence of defects, such as decontamination or disturbance of the lattice growth, which result from the coating material not being applied directly on the surface of the material structure, but in an area still covered by a resist film, is reduced. Thus, a probability that a resist film, which remains after developing, has disturbing influence on the step of applying the coating material on the material structure is reduced.

In a subsequent step S15, the negative resist is removed from the surface of the material structure, wherein the coating material vapor-deposited thereon is also removed therewith. Removing the photoresist takes place by applying or bringing into contact a strong solvent, such as n-methyl-pyrrolidone, with the material structure, such as dipping the material structure into a basin filled with n-methyl-pyrrolidone.

Partially developing the photoresist by means of the polar solvent, namely 2-propanol solvent, leads to a lower probability of metals at the surface of the material structure being destroyed by corrosion, due to the reduced presence of movable ions. The 2-propanol solvent has the property of indeed removing the negative resist from the exposed areas on the one hand, and hence structuring the negative resist, but, for example, not attacking a contact pad implemented of other metals by corrosion on the other hand. The reason for the fact that a contact pad is not attacked by the 2-propanol solvent is that no $OH^-$ ions form in the 2-propanol solvent. The photoresist layer structured or developed as described above also has improved contours as opposed to a photoresist layer that has exclusively been developed with a single organic polar solvent, such as only with a 2-propanol, which has been found out in a corresponding test.

Thus, the above embodiment shows that, by sequentially applying a first developer and a second developer that differs from the first developer in its composition, a structured photoresist layer with improved contours can be provided. A photoresist layer structured by the sequential employment of two different developers here comprises an improved undercut of the resist flank or increased undercut of the resist flank, while a probability of an occurrence of resist films in areas of a treated surface in which the photoresist has not been cross-linked prior to the step of developing is reduced at the same time or alternatively.

In other words, in an embodiment of the present invention, the probability of a formation of thin resist films in non-cross-linked areas of the photoresist is reduced on the one hand and/or the undercut of the resist flank is improved on the other hand, by the use of a sequence of various solvents for developing a photoresist. If the photoresist is a negative resist, a probability of resist films remaining in the non-exposed areas after developing is reduced, while, if the photoresist is a positive resist, a probability of resist films remaining in the exposed areas is reduced. In an embodiment of the present invention, a sequence or series of a 2-propanol and a PGMEA is employed for developing, for example.

The reduced probability of the occurrence of thin resist films in the areas in which the photoresist is not cross-linked or has little cross-linkage, and the concomitant improved removal of the photoresist in the areas in which the photoresist was not cross-linked, allows for more efficient selective treatment of the exposed areas of the surface of a material structure. Here, the exposed areas of the surface can be etched in a more efficient manner after developing, ions can be implanted in these exposed areas, or a coating material can be applied on the exposed areas of the material structure in a more efficient manner, for example.

In other words, in a method for developing a photoresist according to an embodiment of the present invention, a probability that a thin resist film remaining after developing, which remains in an area of the material structure to be exposed, is reduced, so that the probability of a disturbing influence on the selective etching of the material structure, the selective implanting of ions in the exposed areas of the material structure, or the selective coating of the material structure, is reduced.

This allows for more efficient selective further processing of the material structure with the structured photoresist layer, whereby higher yield can be achieved by the improved workability of the exposed areas of the surface of the material structure. The increased yield is accompanied by low production costs for a device having a material structure in which a photoresist layer has been developed with the method for developing the photoresist according to an embodiment of the present invention, than for a device in which the photoresist layer has been developed with a conventional method for developing the photoresist.

At the same time, the improved undercut or higher undercut, which is achieved with the execution of a lift-off method according to an embodiment of the present invention, allows for more efficient execution of the lift-off method. This is because the higher undercut in the lift-off method according to an embodiment of the present invention, provides an improved or sharper tear-off edge in the coating material to be applied afterwards than in a photoresist that was developed with only one developer. In the execution of the lift-off method, the improved tear-off edge leads to a continuous layer of the coating material formed with a reduced probability when applying the coating material, which continuously covers both the areas in which the photoresist has been removed and the areas in which the photoresist has not been removed, so that no lifting-off of the part of the coating material on the photoresist would be possible.

By the probability of the formation of a continuous layer being reduced, ensuing removal of the photoresist with the coating material is possible in more simple and efficient manner, so that the production costs for the processing of a material structure with the lift-off method, which employs the method for developing a photoresist according to an embodiment of the present invention, are again reduced as opposed to a conventional lift-off method, which employs a conventional method for developing the photoresist.

Advantageously, in a method for developing a photoresist according to an embodiment of the present invention, an organic polar solvent can be employed at least over part of the period in which the photoresist is being developed.

The organic polar solvent does not have any corrosive effect, as opposed to the aqueous solution of the TMAH. The corrosive effect on a multi-layer construction of several metals arranged on the material structure, such as a contact pad, thus is prevented or reduced as opposed to a lift-off method not employing an organic polar solvent for developing.

The prevention of the corrosive effect of the developer on the contact pads results in the contact pads being better bondable on a wafer that has been processed with a lift-off method according to an embodiment of the present invention, than the contact pads on a wafer that has not been processed with the organic polar solvent. The prevention of the corrosive effect of the lift-off method leads to a smoother surface of the contact pads, which entails better bondability.

The lift-off method illustrated in FIG. 1 is especially advantageous if the material structure includes a wafer on which a plurality of piezoelectric resonators or BAW filters are implemented. In these, as already explained previously, protection of the contact pads from a corrosive effect of the solvent employed for developing is of great importance.

In the following, the lift-off method set forth in FIG. 1 according to an embodiment of the present invention will be explained on the basis of the schematic views of a material structure being processed with the lift-off method.

Figure 2A:
FIGS. 2A-G are schematic views of a material structure, which is processed with a lift-off method according to an embodiment of the present invention.

FIG. 2A shows the material structure 11 processed with the lift-off method according to the embodiments of the present invention. A contact pad not shown here is attached on a surface of the material structure.

Figure 2B:
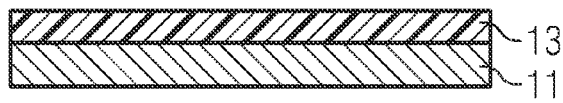

FIG. 2B shows the material structure 11 after a negative resist 13, as described in FIG. 1 in step S3, has been applied on a surface of the material structure 11.

Figure 2C:
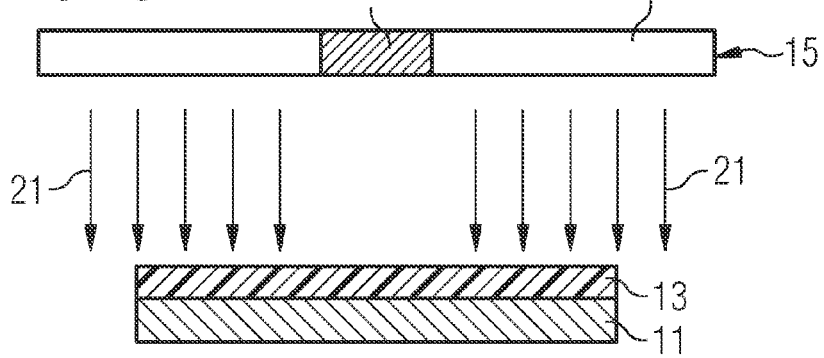

FIG. 2C shows an arrangement with which the negative resist 13 is being exposed. The exposing has already been mentioned in FIG. 1 in step S5. For this, a mask 15 is employed, which has a translucent area 17 and an opaque area 19. A light source (not shown here) is arranged on a side of the mask 15 facing away from the substrate 11. Light beams 21 generated thereby impinge on the mask 15 and are transmitted in the translucent area 17, whereas they cannot pass the mask 15 in the opaque area 19. The light beams 21 then impinge on the negative resist 13 after passing the mask 15, with regions exposed by the light beams 21 and regions not exposed by the light beams 21 forming in the negative resist 13.

Figure 2D:
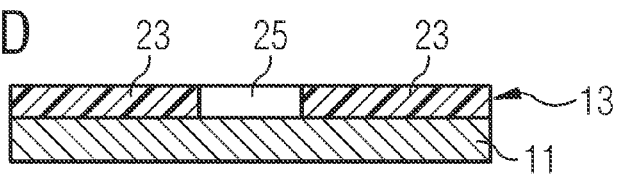

FIG. 2D explains a construction of the substrate 11 with the negative resist 13 after exposing. The negative resist 13 now comprises exposed areas 23, which are illustrated in a hatched manner. Moreover, a non-exposed area 25 is present in the negative resist 13.

The arrangement shown in FIG. 2D is then inserted into an oven in order to increase the cross-linkage of the negative resist 13 in the exposed area 23 of the negative resist 13. In the oven, baking is performed, as already shown in step S7 in FIG. 1, with the duration for baking being about 600 seconds, for example, and there being an internal temperature of about 120° C., for example, in the oven.

Then, the arrangement shown in FIG. 2D is dipped into a first basin filled with a 2-propanol solvent, in order to bring the 2-propanol solvent into contact with the negative resist 13. The period during which the arrangement shown in FIG. 2D is dipped into the basin filled with the 2-propanol solvent, is about 30 seconds. This step of dipping into the first basin is also referred to as developing the photoresist with a first developer and is illustrated as step S9 in FIG. 1.

Figure 2E:
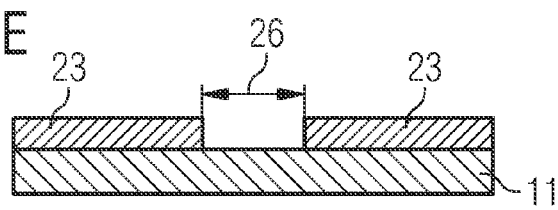

Thereafter, the arrangement shown in FIG. 2D is dipped into a further basin filled with a PGMEA solvent or a PGMEA, in order to bring the PGMEA solvent in contact with the negative resist 13. The period during which the arrangement shown in FIG. 2D is dipped into the basin filled with the PGMEA solvent, is about 20 seconds here. This step is also referred to as developing the photoresist with a second developer and is illustrated as step S11 in FIG. 1. The resulting arrangement is shown in FIG. 2E.

In the steps S9, S11, the negative resist 13 here is removed from the non-exposed area 25 of the negative resist 13. Hence, a trench, which has a trench width 26, forms between the exposed areas 23 of the negative resist 13.

Instead of dipping the arrangement shown in FIG. 2D into the basin filled with the 2-propanol solvent and the basin filled with the PGMEA solvent in a temporally successive manner, the arrangement shown in FIG. 2D could also be set onto a disk in a spin coater. Here, the arrangement shown in FIG. 2D also is part of a wafer set onto the rotating disk, in the embodiment thus modified. While the arrangement shown in FIG. 2D is spun or rotates in the spin coater, the first developer, namely the 2-propanol solvent, is sprayed on. By the centrifugal force, the sprayed-on developer is transported outward continuously, so that a continuous flow of the developer results over the arrangement shown in FIG. 2D. Frequently, the first developer or film of the first developer, which spreads on the wafer surface, at least temporarily covers the entire wafer surface. After developing the arrangement shown in FIG. 2D with the 2-propanol solvent over a period of about 30 seconds, the PGMEA solvent is then sprayed on, which is also transported outward through the centrifugal force. Frequently, the second developer or film of the second developer, which spreads out on the wafer surface, at least temporarily covers the entire wafer surface. Here, it is advantageous that the centrifuge provides for the fact that no residues of the 2-propanol solvent remain or are present on the arrangement shown in FIG. 2D as a result of the centrifugal force, while the PGMEA solvent is being sprayed on.

Optionally, in the modified embodiment, the arrangement shown in FIG. 2D is then cleaned by means of bombardment by oxygen ions or an oxygen plasma, so that residues of the PGMEA solvent and/or development residues remaining after the PGMEA solvent employment are removed. In a modified embodiment of the present invention, the arrangement shown in FIG. 2D is bombarded so that the oxygen ions impinge on the arrangement shown in FIG. 2D in a direction perpendicular to a surface of the layer of the negative resist 13 facing away from the material structure 11. The perpendicular bombardment with the oxygen ions at the same time also allows for removing the so-called "feet" or areas of the negative resist 13 protruding over the tear-off edge of the exposed areas 23 of the negative resist 13 in the top view/plan view and extending along the surface of the material structure 11 into the non-exposed areas 25, which later, after the application of the actual coating material and the removal of the cross-linked photoresist, results in better adhesion or better edges of the remaining or desired coating with the coating material.

Figure 2F:
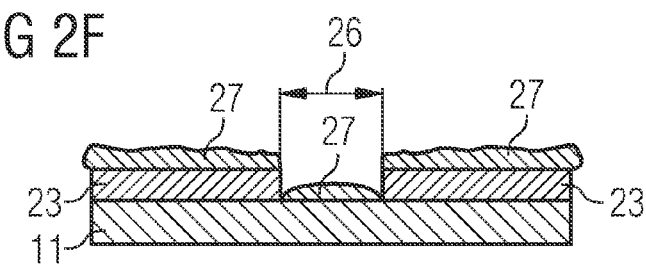

Thereafter, a coating material 27 is vapor-deposited on the surface of the material structure 11 on which the negative resist 13 has been applied and on the exposed area 23 of the negative resist 13. This step is already mentioned in FIG. 1 as step S13 of applying the coating material 27. The arrangement thus created is shown in FIG. 2F. The material structure 11 and the exposed area 23 of the negative resist 13 are coated by the coating material 27. The material structure 11 is coated with the coating material 27 in the areas in which the negative resist 13 has not been exposed and has been removed in the step of developing.

Figure 2G:
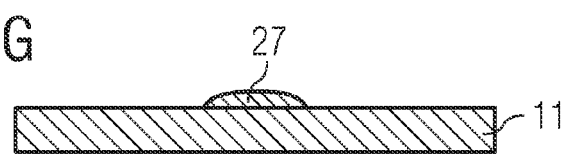

Then the arrangement shown in FIG. 2F is brought into contact with a strong solvent, which is also capable of removing the negative resist 13 in the exposed areas 23. Hereby, the exposed areas 23 of the negative resist 13, and together with it the coating material 27 arranged thereon, are removed. This procedural step is already illustrated in FIG. 1 as step S15 of removing the photoresist. The arrangement thus created is shown in FIG. 2G.

It is extremely advantageous in the lift-off method according to an embodiment of the present invention shown here, for example, that a contact pad, not shown here, on a surface of the material structure is not attacked by the 2-propanol solvent. The contact pad is thus not limited in its bondability and still capable of making contact with a circuit structure arranged in the material structure 11 without restriction. As already explained previously, the reason for this lies in the fact that the 2-propanol solvent does not produce any OH$^-$ ions in developing. Thereby, the corrosion of the contact pad is prevented.

The advantages of the lift-off method, which employs a method for developing a photoresist according to an embodiment of the present invention and partially applies an organic polar developer, as opposed to a lift-off method applying a TMAH solvent, become obvious in an optical inspection of the wafer surfaces. In the optical inspection, it can be seen that the pads and measurement contacts of the wafers having been treated with the TMAH solvent appear darker than the pads and measurement contacts of the wafer having been developed with the organic polar developer. The darker color of the pads and of the measurement contacts results from the fact that the pads and the measurement contacts having been treated with the aqueous solution of the tetra methyl ammonium hydroxide are subject to a high number of OH$^-$ ions and hence corrode strongly, while in the lift-off method according to an embodiment of the present invention the corrosion is prevented. The darker color of the pads here indeed is an indication for the roughness of the surface, wherein the roughness of the surface of the pads and measurement contacts treated with the TMAH solvent is increased as opposed to the roughness of the surface of the pads and measurement contacts partially treated with the organic polar solvent.

Moreover, an influence of a duration of baking on the width of the forming trenches has been examined. As opposed to the lift-off method only employing a solution of the TMAH for developing, the formed trenches in the lift-off method according to an embodiment of the present invention, which applies an organic polar solvent for developing, are narrower, because baking in the lift-off method according to an embodiment of the present invention is performed over a longer period than baking in the lift-off method employing the TMAH solvent for developing. Here, the trenches grow over with increasing duration of baking.

It can also be seen in the examinations that the arising flanks of the negative resist area, even after longer baking, have a steepness lying on the order magnitude of the steepness of the flanks of the lift-off method only applying TMAH solvent for developing. Thus, the flank steepness of the negative resist area is not significantly reduced by the application of the lift-off method according to an embodiment of the present invention. At the same time, the undercut or overhang at the flanks of the negative resist area in the lift-off method according to an embodiment of the present invention is increased as opposed to the lift-off method in which the TMAH, and not the organic polar solvent, is employed.

In above embodiments, employment of the method for developing a photoresist according to an embodiment of the present invention is shown in a lift-off method. However, arbitrary methods or production methods in which a photoresist or a photoresist layer is developed are alternatives hereto.

In above embodiments, the first developer comprises a 2-propanol solvent and the second developer comprises a PGMEA solvent, but any developers, such as any polar organic developers, are alternatives hereto, as long as the first developer and the second developer differ in their compositions.

In addition, in above embodiments, the photoresist is applied so that a homogenous or continuous layer of equal photoresist composition forms on the material structure, which substantially only comprises a photoresist material, but any forms of applying the photoresist so that no homogenous or continuous layer arises are also possible.

In an embodiment of the present invention, between the step of developing the photoresist with the first developer or applying the first developer and developing the photoresist with the second developer or applying the second developer, no processing step or no processing leading to further cross-linkage of the photoresist is performed. But process steps promoting the cross-linkage between the step of developing the photoresist with the first developer and developing the photoresist with the second developer are alternatives hereto.

In an embodiment of the present invention, the step of developing with the second developer immediately follows the step of developing the photoresist with the first developer. The duration of a pause between the step of developing the photoresist with the first developer and the step of developing the photoresist with the second developer here ranges from about 0 seconds to 2 seconds or 0 seconds to 0.5 seconds, but any durations of the pause between the step of developing the photoresist with the first developer and the step of developing the photoresist with the second developer are alternatives hereto. In an embodiment of the present invention, between the step of developing the photoresist with the first developer and the step of developing the photoresist with the second developer, also cleaning the material structure to be treated or the surface of the photoresist to be developed with any cleaning agent, such as water, could take place.

In an embodiment of the present invention, the first developer is stronger or more aggressive than the second developer, wherein, in the present application, a developer removing a predetermined amount of a photoresist over a shorter duration than a weaker developer is understood by a stronger developer. Alternatively, the second developer could, however, also be stronger than the first developer. In an embodiment of the present invention, the first developer comprises an organic polar developer, such as an alcohol or a 2-propanol. At the same time, in an embodiment of the present invention, the second developer comprises a second organic polar developer, such as a PGMEA. But any embodiments of the first and second developers differing in their compositions are alternatives hereto.

In an embodiment of the present invention, an aqueous content, which is defined as a ratio of a weight of water in the developer to an overall weight of the developer, ranges from 0 to 0.01 in the first developer and/or the second developer. But any values of the aqueous content are alternatives hereto.

In an embodiment, a duration over which the photoresist is being developed with the first developer, or the step of applying the first developer, is longer than a duration over which the photoresist is being developed with the second developer, or a duration of applying the second developer, wherein the ratio of the first duration, namely the duration in which the photoresist is being developed with the first developer, to the second duration, namely the duration in which the photoresist is being developed with the second developer, ranges from 1.2 to 3. But any ratios of the first duration to the second duration are alternatives hereto.

The first duration ranges from about 3 seconds to about 300 seconds or ranges from about 20 seconds to about 40 seconds in an embodiment of the present invention, whereas the second duration ranges from about 2 seconds to about 200 seconds or ranges from about 10 seconds to about 30 seconds. But any values of the first duration and of the second duration are alternatives hereto.

In an embodiment of the present invention, between the step of developing the photoresist with the first developer and developing the photoresist with the second developer, a step of removing the first developer from the photoresist is performed, but this step could alternatively also be omitted.

In an embodiment of the present invention, when developing a photoresist, at first a first developer and then, in a special sequence, a second developer is applied, so as to remove the non-cross-linked areas of the photoresist, wherein the first developer and the second developer differ in their compositions. As an alternative hereto, after applying the second developer, a third developer for developing the photoresist could be employed, which differs in its composition from the second developer and/or the first developer. Employment of a fourth developer or even further developers, which differ from the first and second developers, would also be possible.

In a modified embodiment, when developing the photoresist with the first developer, the first developer is sprayed onto the photoresist, and in the step of developing with the second developer the second developer is sprayed onto the photoresist. But any forms of bringing the first developer or the second developer into contact with the photoresist are alternatives hereto.

In a modified embodiment, when developing the photoresist with the first developer or when developing the photoresist with the second developer, the first developer and/or the second developer is applied on the photoresist, while the material structure with the photoresist is spun or rotated, so that part of the first developer and/or of the second developer is continuously removed during developing or during bringing the first developer and/or or the second developer into contact with the photoresist. But any forms of bringing the first developer and/or the second developer into contact with the photoresist are alternatives hereto.

As already noted previously, the second developer may also be stronger than the first developer. In the case of the above-described lift-off method, this may cause overhanging tear-off edges, at which the coating material 27 can be interrupted securely, to form in the remaining or exposed areas 23 of the negative resist 13 (see FIG. 2F) at the edges that later are to define the periphery of the coating material 27 (see FIG. 2G). To this end, the developing time of the first developer may, for example, be chosen greater than the developing time of the second developer, for example, such that the first developer removes the non-exposed parts 25 of the resist 13, for example, up to the center or even deeper, maybe even down to the material structure 11, and the second, stronger developer can start immediately down near the material structure 11, in order to remove the negative resist 13 also in lateral direction. As mentioned above, the developers may both be polar developers.

In an embodiment of the present invention, after developing the photoresist with the second developer, the material structure is brought into contact with an oxygen plasma, in order to remove residues of the second developer from the photoresist and/or development residues of a general nature, which remain after the second development step, but this process step could also be omitted. The bombardment of the photoresist is done in a direction substantially perpendicular to a surface of the photoresist facing away from the surface of the material structure, but wherein the photoresist may, as an alternative hereto, also be bombarded with oxygen ions or an oxygen plasma in arbitrary directions.

In an embodiment, the material structure may be embodied as a wafer, a semiconductor die, e.g., a dice or any other form of material structure.

In an embodiment, baking the material structure is performed over a duration ranging from about 300 seconds to about 1500 seconds, and advantageously ranging from about 500 seconds to about 600 seconds, but any durations for performing the baking are possible.

In an embodiment of the present invention, the temperature present at the material structure is adjusted to a value ranging from about 110° C. to about 150° C. during baking, but any temperatures are possible for the process of baking. In an embodiment, baking has been performed in an oven, but any devices in which a correspondingly high temperature can be generated over a corresponding period, such as temperature chambers, are alternatives.

In an embodiment, the material structure has been vapor-deposited with gold, titanium or platinum when applying the coating material. Any materials, however, are alternatives hereto.

In an embodiment, removing the negative resist took place by means of an n-methyl-pyrrolidone solvent. But any solvents capable of removing the photoresist remaining on the material structure are alternatives.

In an embodiment of the present invention, a negative resist was employed in the method for developing a photoresist. But the method for developing a photoresist according to an embodiment of the present invention could also be performed with positive resists.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A method for developing a photoresist applied as a layer over a substrate, the method comprising:

applying a first developer to the photoresist over a first duration to remove non-cross-linked parts of the photoresist in non-cross-linked lateral areas of the photoresist down to at least a midpoint of a thickness of the photoresist; and applying a second developer to the photoresist over a second duration that is shorter than the first duration to remove remaining non-cross-linked parts of the photoresist in the non-cross-linked lateral areas of the photoresist and also laterally remove photoresist at a lateral circumference of the non-cross-linked lateral areas of the photoresist, wherein the first developer and the second developer differ in their compositions such that the second developer is stronger than the first developer, the application of the second developer being performed such that, after the application of the second developer, the substrate is exposed in the non-cross-linked lateral areas of the photoresist and edges of the photoresist circumscribing the non-cross-linked lateral areas form overhanging tear-off edges.

2. The method of claim 1, wherein the photoresist is arranged as a homogenous layer on a material structure.

3. The method of claim 1, wherein the applying the second developer follows the applying the first developer without further cross-linkage of the photoresist.

4. The method of claim 1, wherein the first developer comprises a first organic polar developer.

5. The method of claim 1, wherein the first developer comprises an alcohol.

6. The method of claim 1, wherein the first developer comprises a 2-propanol.

7. The method of claim 1, wherein the second developer comprises a second organic polar developer.

8. The method of claim 1, wherein the second developer comprises a PGMEA.

9. The method of claim 1, wherein a ratio of the first duration to the second duration ranges from about 1.2 to about 3.

10. The method of claim 1, wherein the first duration ranges from about 3 seconds to about 300 seconds.

11. The method of claim 10, wherein the first duration ranges from about 20 seconds to about 40 seconds.

12. The method of claim 1, wherein the second duration ranges from about 2 seconds to about 200 seconds.

13. The method of claim 12, wherein the second duration ranges from about 10 seconds to about 30 seconds.

14. The method of claim 1, further comprising removing the first developer from the photoresist between the applying the first developer and the applying the second developer.

15. The method of claim 1, wherein the applying the first developer comprises spraying the first developer onto the photoresist.

16. The method of claim 1, wherein the applying the first developer comprises bringing the first developer into contact with the photoresist applied on a material structure, wherein the material structure with the photoresist is spun or rotated during the bringing the first developer into contact with the photoresist so that part of the first developer is removed from the photoresist.

17. The method of claim 1, wherein the applying the second developer comprises spraying the second developer onto the photoresist.

18. The method of claim 1, wherein the applying the second developer comprises bringing the second developer into contact with the photoresist applied on a material structure, wherein the material structure with the photoresist is spun or rotated during the bringing the second developer into contact with the photoresist so that part of the second developer is removed from the photoresist.

19. The method of claim 1, further comprising bringing the photoresist into contact with an oxygen plasma after the applying the second developer, to remove development residues remaining after the second developing.

20. The method of claim 19, wherein the photoresist is applied on a surface of the material structure, and the bringing the photoresist into contact with the oxygen plasma comprises bombarding the photoresist with the oxygen plasma, wherein particles of the oxygen plasma are bombarded onto the photoresist substantially in a direction perpendicular to a surface of the photoresist facing away from a surface of the material structure.

21. The method according to claim 1, wherein the step of applying the second developer follows the step of applying the first developer by less than 2 seconds or by less than 2 seconds plus a time for application of a cleaning agent to the photoresist for removing the first developer.

22. The method according to claim 1, further comprising partially exposing the photoresist to define non-cross-linked lateral areas and cross-linked lateral areas of the photoresist, wherein the steps of applying the first developer and applying the second developer are performed such that at all non-cross-linked lateral areas defined by the partially exposing the photoresist, the photoresist is removed down to at least a midpoint of a thickness of the photoresist by the first developer, after the application of the second developer, the substrate is exposed in all non-cross-linked lateral areas of the photoresist, and the application of the second developer does not expose the substrate at portions of the cross-linked lateral areas.

23. A lift-off method comprising:

applying a photoresist as a layer onto a surface of a material structure;

partially exposing the photoresist;

developing the photoresist by applying a first developer to the photoresist over a first duration to remove non-cross-linked parts of the photoresist in non-cross-linked lateral areas of the photoresist down to at least a midpoint of a thickness of the photoresist and then applying a second developer to the photoresist over a second duration that is shorter than the first duration to remove remaining non-cross-linked parts of the photoresist in the non-cross-linked lateral areas of the photoresist and also laterally remove photoresist at a lateral circumference of the non-cross-linked lateral areas of the photoresist, wherein the first developer and the second developer differ in their compositions such that the second developer is stronger than the first developer, the application of the second developer being performed such that, after the application of the second developer, the surface of the material structure is exposed in the non-cross-linked lateral areas of the photoresist and edges of the photoresist circumscribing the non-cross-linked lateral areas form overhanging tear-off edges;

applying a coating material on the surface of the material structure and the developed photoresist; and removing the developed photoresist so that the coating material only remains on the surface of the material structure.

24. The lift-off method of claim 23, wherein the partially exposing the photoresist is followed by baking the material structure with the partially exposed photoresist applied on the surface of the material structure.

25. The lift-off method of claim 24, wherein a duration of baking the material structure ranges from about 300 seconds to about 1500 seconds.

26. The lift-off method of claim 25, wherein a duration of baking the material structure ranges from about 500 seconds to about 600 seconds.

27. The lift-off method of claim 24, wherein baking is performed at a temperature ranging from about 110° C. to about 150° C.

28. The lift-off method of claim 24, wherein the removing the photoresist includes bringing the material structure into contact with a solvent comprising n-methyl-pyrrolidone.

29. The lift-off method of claim 24, wherein the material structure comprises a metal layer that is at least partially brought into contact with the first developer or the second developer during the developing the photoresist.

30. The lift-off method of claim 29, wherein the material structure comprises a metal layer, comprising a first metal material and a second metal material different from the first metal material.

31. The lift-off method of claim 24, wherein the coating material comprises titanium, gold or platinum.

32. The lift-off method of claim 24, wherein the material structure comprises a wafer.

33. The lift-off method of claim 24, wherein the material structure comprises a chip in which a circuit of a piezoelectric resonator is implemented.

34. A lift-off method according to claim 23,
wherein the applying the second developer follows the applying the first developer by less than 2 seconds or by less than 2 seconds plus a time for application of a cleaning agent to the photoresist for removing the first developer.

35. The lift-off method according to claim 23, wherein the applying the first developer to the photoresist during the development the photoresist, is performed such that the non-cross-linked parts of the photoresist in the non-cross-linked lateral areas of the photoresist is not completely removed so that a not-zero portion of the thickness of the photoresist remains in the non-cross-linked lateral areas and the surface of the material structure is not exposed before applying the second developer to the photoresist.

36. The method according to claim 34, wherein the step of applying the second developer follows the step of applying the first developer by less than 2 seconds or by less than 2 seconds plus a time for application of a cleaning agent to the photoresist for removing the first developer.

37. A method for developing a photoresist over a substrate, the method comprising:
    partially exposing the photoresist to define non-cross-linked lateral areas and cross-linked lateral areas of the photoresist;
    applying a first developer to the photoresist to remove non-cross-linked lateral areas of the photoresist; and
    applying a second developer to the photoresist to remove remaining non-cross-linked parts of the photoresist in the non-cross-linked lateral areas of the photoresist and also laterally remove photoresist at a lateral circumference of the non-cross-linked lateral areas of the photoresist, wherein the first developer and the second developer differ in their compositions such that the second developer is stronger than the first developer,
    wherein the steps of partially exposing, applying the first developer, and applying the second developer are performed such that
    at all non-cross-linked lateral areas defined by the partially exposing the photoresist, the photoresist is removed down to at least a midpoint of a thickness of the photoresist by the first developer,
    after application of the second developer, the substrate is exposed in all non-cross-linked lateral areas of the photoresist, and edges of the photoresist circumscribing the non-cross-linked lateral areas form overhanging tear-off edges, and
    the application of the second developer does not expose the substrate at portions of the cross-linked lateral areas.

\* \* \* \* \*